(12) United States Patent
Tsai et al.

(10) Patent No.: US 12,713,949 B2
(45) Date of Patent: Aug. 18, 2026

(54) SEMICONDUCTOR DEVICE AND METHOD FOR MANUFACTURING THE SAME

(71) Applicant: Taiwan Semiconductor Manufacturing Company, Ltd., Hsinchu (TW)

(72) Inventors: Hung-Wei Tsai, Hsinchu (TW); Chih-Wei Wu, Hsinchu (TW); Ying-Ching Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 585 days.

(21) Appl. No.: 18/123,154

(22) Filed: Mar. 17, 2023

(65) Prior Publication Data

US 2024/0312940 A1 Sep. 19, 2024

(51) Int. Cl.

| | |
|---|---|
| ***H01L 23/00*** | (2006.01) |
| ***H10W 70/63*** | (2026.01) |
| ***H10W 90/00*** | (2026.01) |
| *H10W 72/00* | (2026.01) |
| *H10W 72/20* | (2026.01) |
| *H10W 74/00* | (2026.01) |

(52) U.S. Cl.

CPC ......... *H10W 70/635* (2026.01); *H10W 90/00* (2026.01); *H10W 72/07227* (2026.01); *H10W 72/07236* (2026.01); *H10W 72/07253* (2026.01); *H10W 72/237* (2026.01); *H10W 74/00* (2026.01); *H10W 90/721* (2026.01); *H10W 90/722* (2026.01)

(58) Field of Classification Search

None

See application file for complete search history.

(56) References Cited

U.S. PATENT DOCUMENTS

| | | | | |
|---|---|---|---|---|
| 9,443,796 | B2 * | 9/2016 | Chou | H01L 21/764 |
| 9,786,628 | B2 * | 10/2017 | Chou | H01L 24/93 |
| 2018/0342475 | A1 * | 11/2018 | Wirz | H01L 24/03 |

* cited by examiner

*Primary Examiner* — Long Pham

(74) *Attorney, Agent, or Firm* — Birch, Stewart, Kolasch & Birch, LLP

(57) ABSTRACT

A semiconductor device and a method for manufacturing the same are provided. The semiconductor device includes a first semiconductor module, a reorientation layer, a second semiconductor module and a plurality of jointing materials. The first semiconductor module has at least one first conductive structure and at least one second conductive structure. The reorientation layer covers part of the second conductive structure to form an opening. The second semiconductor module has at least one third conductive structure and at least one fourth conductive structure. The jointing materials are disposed between the first conductive structure and the third conductive structure, and disposed in the opening.

20 Claims, 12 Drawing Sheets

210
M21
B22
CP21
B21
300

210
OP2
M21
B22
CP21
B21
240
300

SEMICONDUCTOR DEVICE AND METHOD FOR MANUFACTURING THE SAME

BACKGROUND

The disclosure relates in general to a semiconductor device and a method for manufacturing the same, and more particularly to a semiconductor device integrating at least two semiconductor modules and a method for manufacturing the same.

With the rapid development of electronic devices, a semiconductor technology that integrates multiple semiconductor modules is developed. More than two semiconductor modules could be stacked to enhance its function. However, the connections between the two semiconductor modules must be accurately aligned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
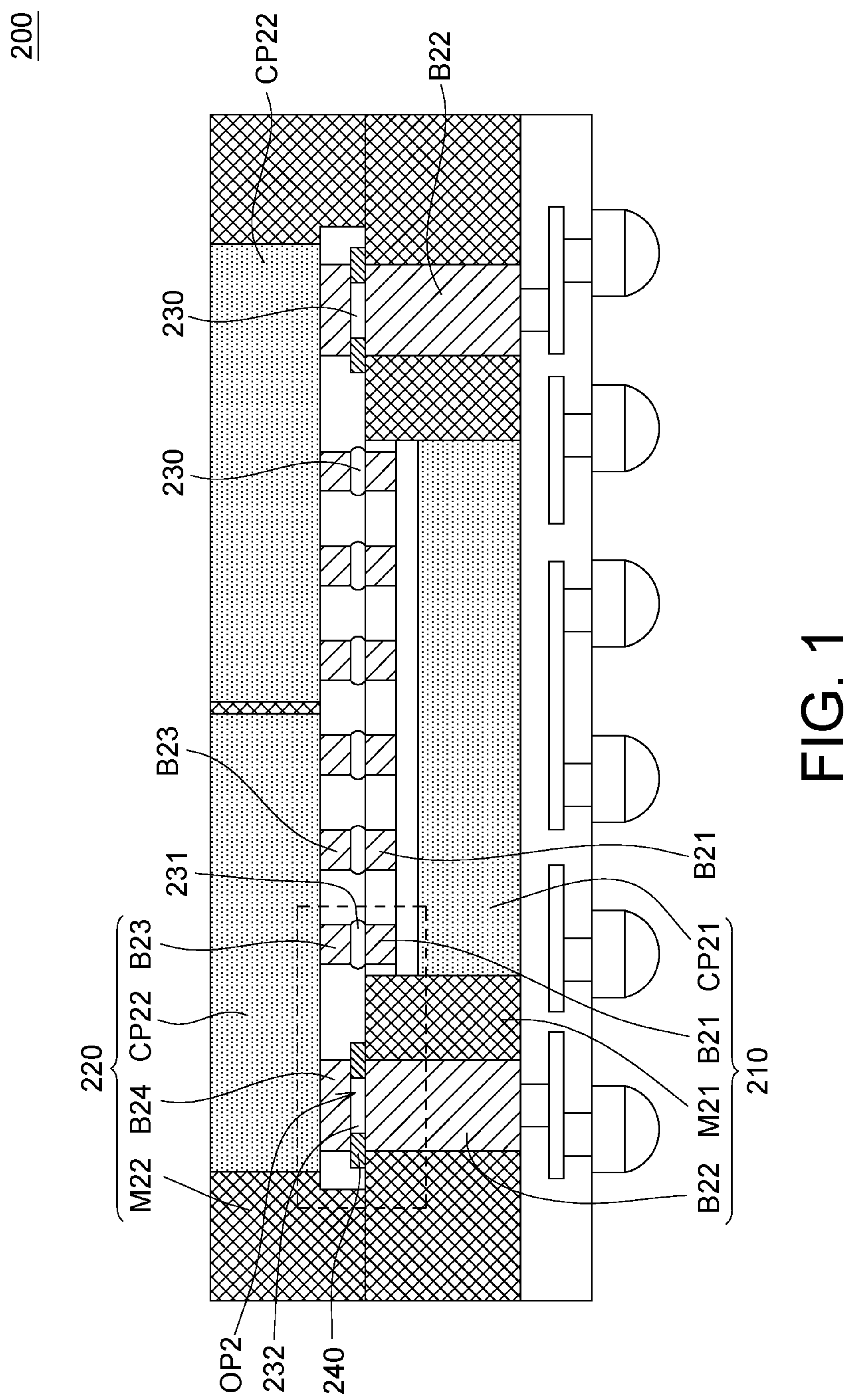
FIG. 1 shows a semiconductor device according to another embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are disposed in direct contact, and may also include embodiments in which additional features may be disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 200 according to one embodiment. The semiconductor device 200 includes a first semiconductor module 210, a second semiconductor module 220, at least one first jointing material 231, at least one jointing material 232 and a reorientation layer 240. The second semiconductor module 220 is stacked on the first semiconductor module 210. The first semiconductor module 210 includes, for example, a first chip CP21, at least one first conductive structure B21, at least one second conductive structure B22 which is larger than the first conductive structure B21 and a first molding material M21. For example, the first conductive structure B21 could be a bump disposed on the first chip CP21, and the second conductive structure B22 could be a through mold via (TMV).

The first chip CP21 and the second conductive structure B22 are formed individually. For example, the second conductive structure B22 could be disposed first, and then the first chip CP21 is picked and placed at a predetermined location. During the manufacturing process, the second conductive structure B22 may not be accurately located at a predetermined location and the first chip CP21 may not be accurately located at a predetermined location, therefore, the second conductive structure B22 and the first chip CP21 may not be located at predetermined relative positions.

To be specific, the first conductive structure B21 and the second conductive structure B22 are formed individually. For example, the second conductive structure B22 could be disposed first, and then the first chip CP21 formed the first conductive structure B11 thereon is picked and placed at a predetermined location. During the manufacturing process, the first conductive structure B21 may not be located at a predetermined location on the first chip CP21, and therefore, the second conductive structure B22 and the first conductive structure B21 may not be located at the predetermined relative positions.

The second semiconductor module 220 includes at least one second chip CP22, at least one third conductive structure B23, at least one fourth conductive structure B24 and a second molding material M22. For example, the third conductive structure B23 and the fourth conductive structure B24 could be bumps disposed on the second chip CP22.

In case of that the second conductive structure B22 and the first conductive structure B21 are not located at predetermined relative positions, the second conductive structure B22 and the fourth conductive structure B24 may be offset from each other.

The first jointing material 231 is used to join the first conductive structure B21 and the third conductive structure B23, and the second jointing material 232 is used to join the second conductive structure B22 and the fourth conductive structure B24. The first jointing material 231 and the second jointing material 232 may be the same material or different materials. For example, the first jointing material 231 and the second jointing material 232 may be solder.

The reorientation layer 240 covers part of the second conductive structure B22 to form an opening OP2. The reorientation layer 240 could compensate the offset between the second conductive structure B22 and the fourth conductive structure B24. The function of the reorientation layer 240 is illustrated via its top view.

Figure 2:
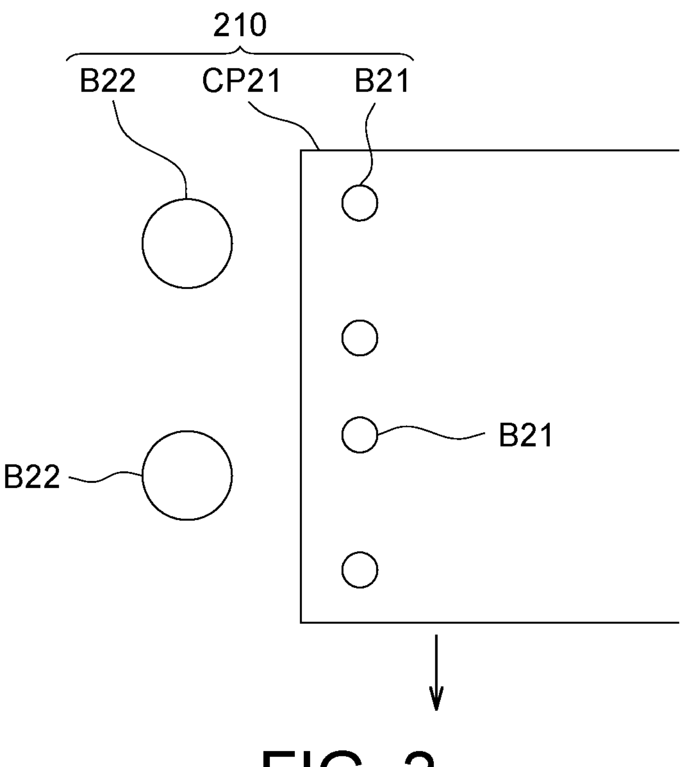
FIG. 2 shows a top view of a first semiconductor module according to another embodiment.

Please refer to FIG. 2, which shows a top view of the first semiconductor module 210 according to one embodiment. In FIG. 2, the second conductive structure B22 (e.g. the TMV) is disposed first and then the first chip CP21 is placed in a wrong position. For example, as shown in FIG. 2, the first chip CP21 is offset downward. Because the first chip CP21 is placed in the wrong position, the relative locations of the first conductive structure B21 and the second conductive structure B22 are not located the predetermined relative locations.

Figure 3:
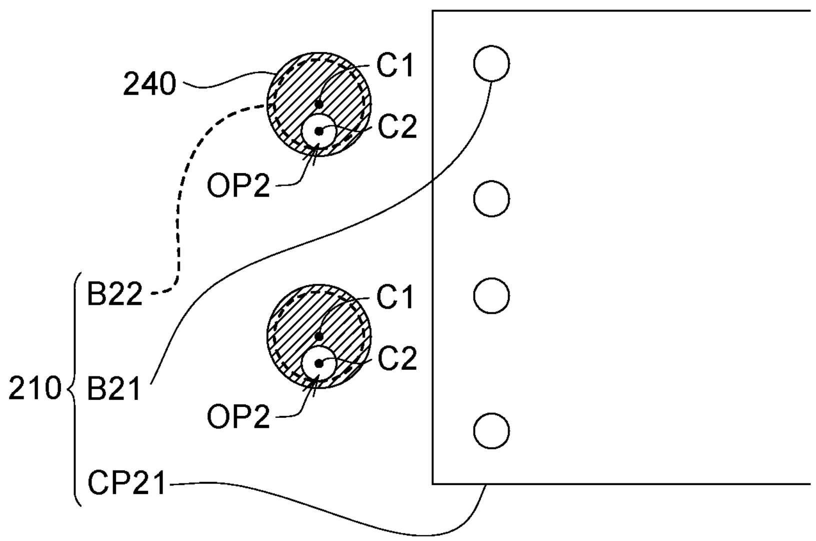
FIG. 3 shows a top view of a reorientation layer that covers part of a second conductive structure.

Next, please refer to FIG. 3, which shows a top view of the reorientation layer 240 that covers part of the second conductive structure B22. The reorientation layer 240 covers part of the second conductive structure B22 to form the opening OP2. The area to be disposed the second jointing material 232 (shown in FIG. 1) is the area of the opening OP2. The reorientation layer 240 is not used to be disposed the second jointing material 232 (shown in FIG. 1). The second conductive structure B22 contacts only part of the second conductive structure B22, i.e. the area exposed by the opening OP2.

A center C2 of the opening OP2 and a center C1 of the second conductive structure B22 are located at different locations. The opening OP2 might expose the center C1 of the second conductive structure B22. Or, the reorientation layer 240 might cover the center C1 of the second conductive structure B22. The distance between the center C1 and the center C2 is substantially equal to the offset of the first chip CP21 (or the first conductive structure B21). The direction of the connecting line between the center C1 and the center C2 is substantially parallel to the offset direction of the first chip CP21 (or the first conductive structure B21).

The shape of the opening OP2 may be round, oval or rectangular. The opening OP2 is smaller than the surface of the second conductive structure B22. The opening OP2 is smaller than the surface of the fourth conductive structure B24. The opening OP2 might be larger than, equal to or smaller than the surface of the first conductive structure B21. The opening OP2 might be larger than, equal to or smaller than the surface of the third conductive structure B23.

In the top view of the reorientation layer 240, the shape of the reorientation layer 240 might be an eccentric ring. The width of the eccentric ring at different locations might be different. The outer edge of the reorientation layer 240 might be located at the outside of the second conductive structure B22. The inner edge of the reorientation layer 240 might be located in the area of the second conductive structure B22.

Figure 4:
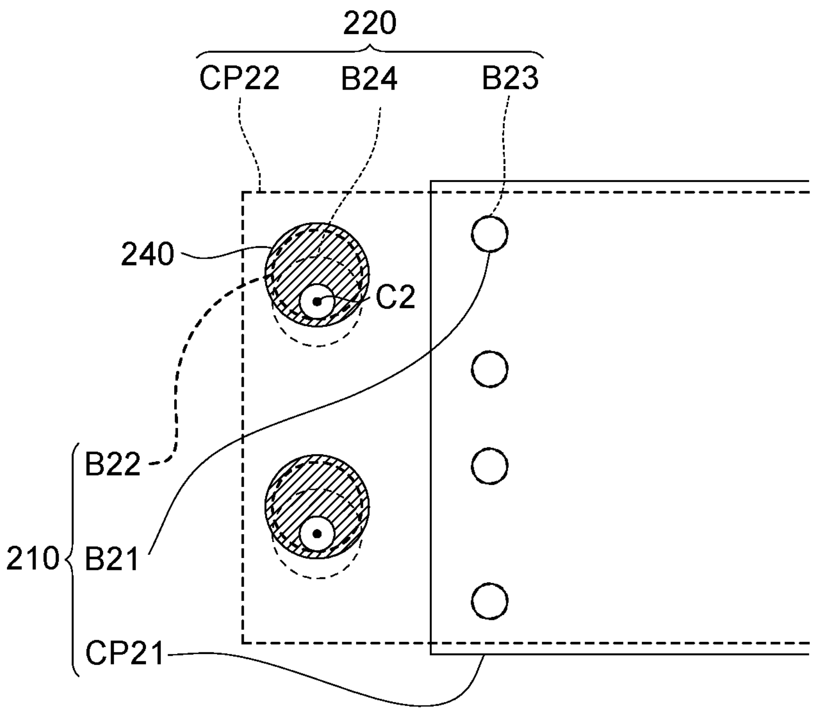
FIG. 4 shows a top view of the second semiconductor module that is stacked on the first semiconductor module of FIG. 2B.

Afterwards, please refer to FIG. 4, which shows a top view of the second semiconductor module 220 that is stacked on the first semiconductor module 210 of FIG. 2B. When the second semiconductor module 220 is stacked on the first semiconductor module 210 of FIG. 3, the fourth conductive structure B24 could self-aligned with the center C2, so the reorientation layer 240 could compensate the offset between the second conductive structure B22 and the fourth conductive structure B24. As shown in FIG. 4, the third conductive structure B23 can be connected to the first conductive structure B21 well. After bonding the second semiconductor module 220 and the first semiconductor module 210, the first conductive structure B21 and the third conductive structure B23 are aligned with each other, and the second conductive structure B22 and the fourth conductive structure B24 are offset with each other. Because the area of the second conductive structure B22 and the area the fourth conductive structure B24 are larger than the area of the first conductive structure B21 and the area of the third conductive structure B23, the contacting area between the second conductive structure B22 and the fourth conductive structure B24 is still large.

Figures 5A, 5B:
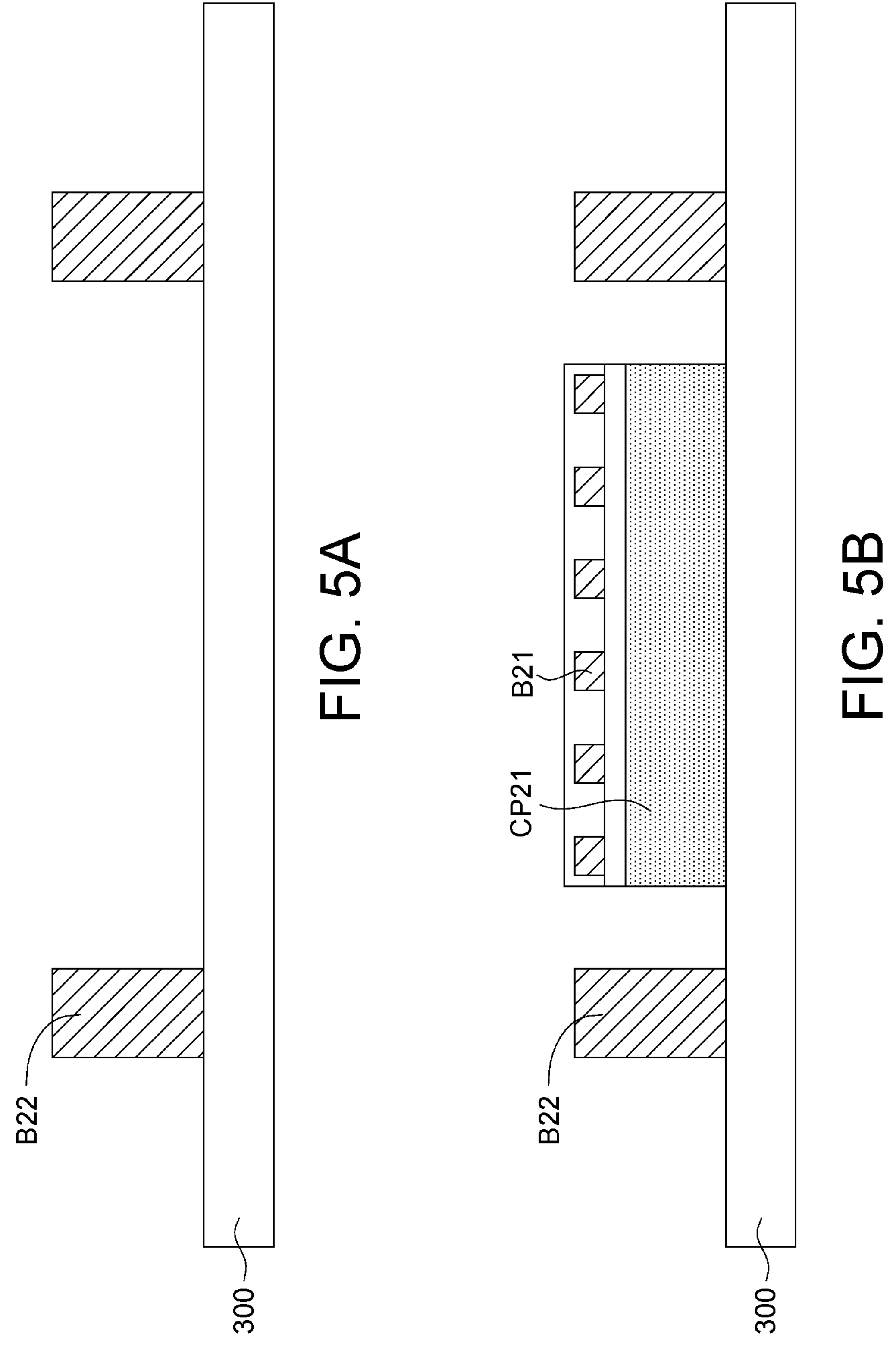
FIGS. 5A to 5K illustrate a manufacturing method of the semiconductor device.
Figures 5C, 5D:
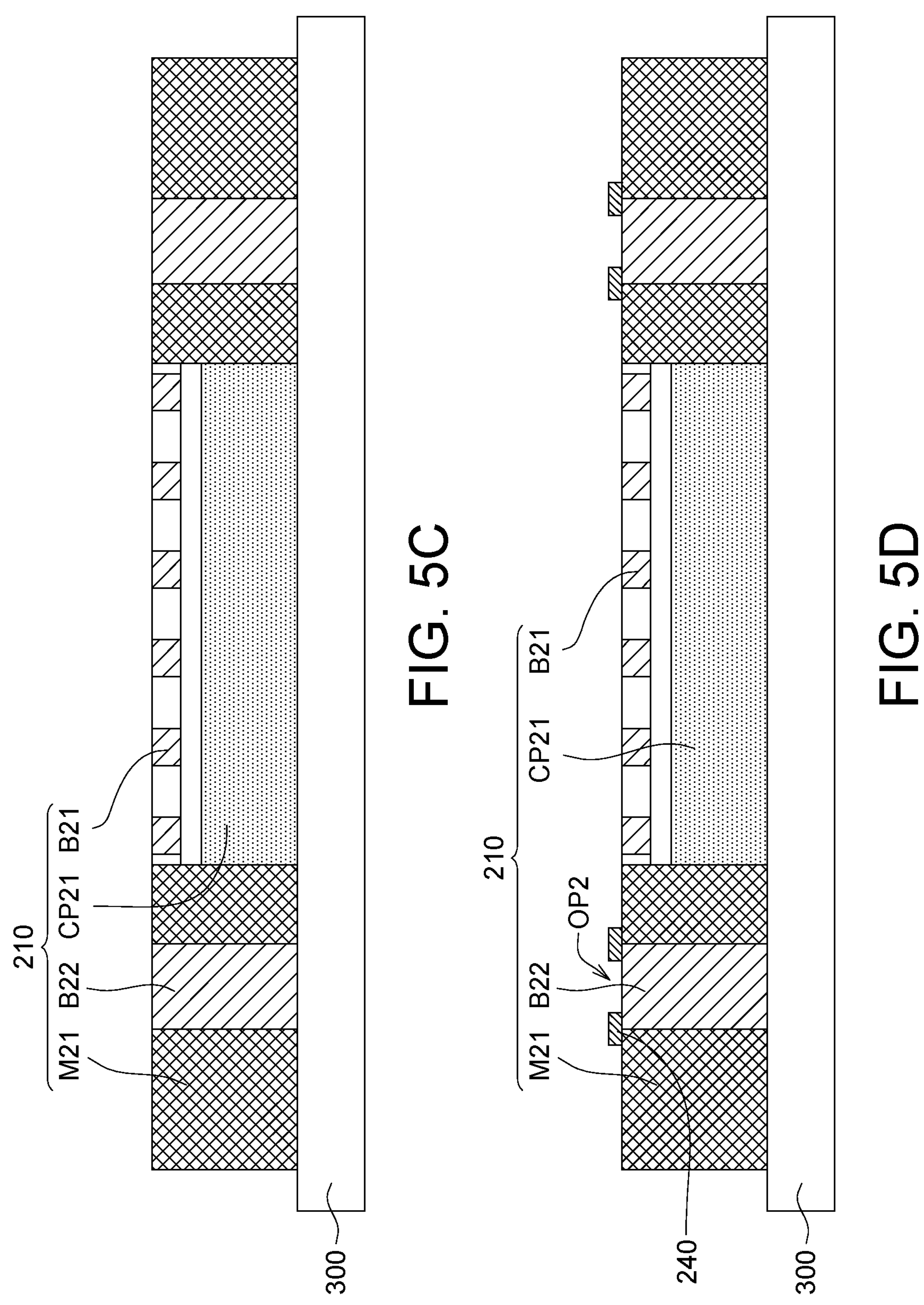

Please refer to FIGS. 5A to 5K, which illustrate a manufacturing method of the semiconductor device 200. In FIGS. 5A to 5C, the first semiconductor module 210 including the at least one first conductive structure B21 and the at least one second conductive structure B22 which is larger than the first conductive structure B21 is disposed.

As shown in FIG. 5A, the second conductive structure B22, i.e. the TMV, is grown on a carrier 300. The material of the second conductive structure B22 could be metal, such as copper, gold or silver.

Then, as shown in FIG. 5B, the first chip CP21 is picked and placed on the carrier 300. The first conductive structure B21 is disposed on the first chip CP21. In one case, the first chip CP21 might be placed in a wrong position, so the relationship between the first conductive structure B21 and the second conductive structure B22 might not be located at the predetermined relative locations.

Next, as shown in FIG. 5C, the first molding material M21 covers the first chip CP21 and exposes the first conductive structure B21 and the second conductive structure B22. For example, the first molding material M21 is disposed first, and then the Chemical Mechanical Polishing (CMP) process or the Chemical Mechanical Grinding (CMG) process is performed to expose the first conductive structure B21 and the second conductive structure B22.

Afterwards, as shown in FIG. 5D, the reorientation layer 240 is disposed to cover part of the second conductive structure B22 to form the opening OP2. For example, a material of the reorientation layer 240 is a dielectric material. The dielectric material is disposed on the second conductive structure B22 first, and then the dielectric material is etched via a photo-mask or a hard mask layer to form the opening OP2. The location and the area of the opening OP2 are designed according to the first conductive structure B21. For example, if the first conductive structure B21 shifts, the location and the area of the opening OP2 may be changed to keep the center C2 (shown in FIG. 3) of the opening and the first conductive structure B21 at the predetermined relative locations.

Figure 5E:
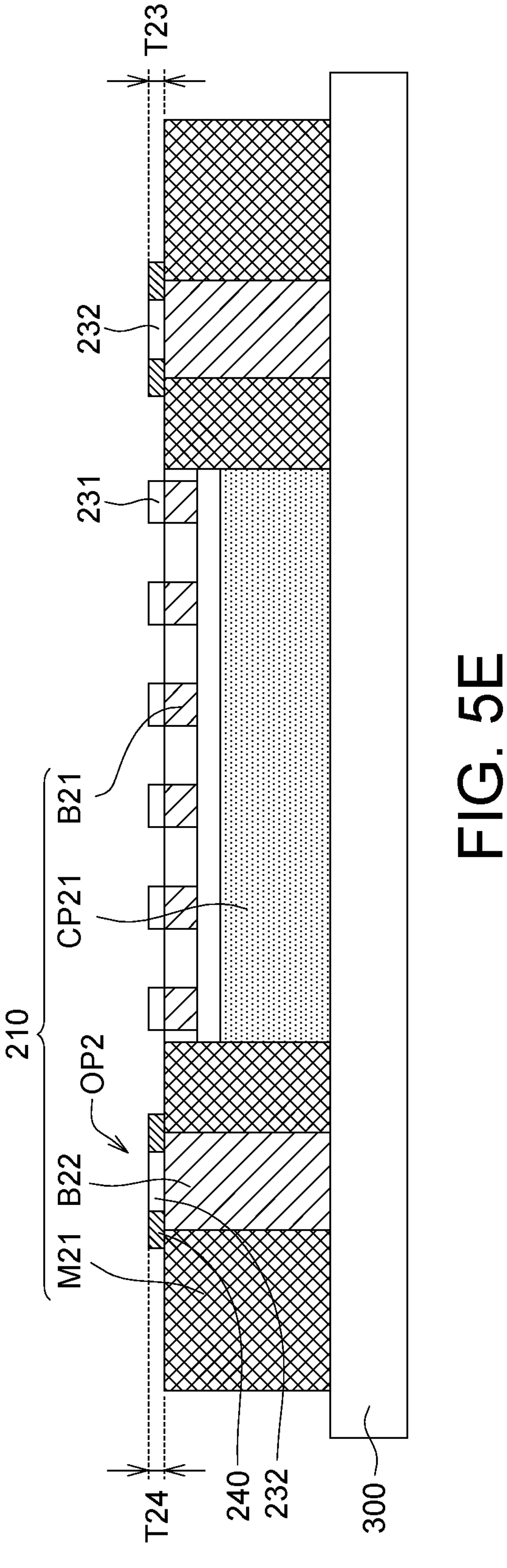

Then, as shown in FIG. 5E, the first jointing material 231 is disposed on the first conductive structure B21 and the second jointing material 232 is disposed in the opening OP2. The second jointing material 232 does not overlap the reorientation layer 240. A thickness T23 of each of the first jointing material 231 and the second jointing material 232 is substantially identical to a thickness T24 of the reorientation layer 240.

Figure 5F:
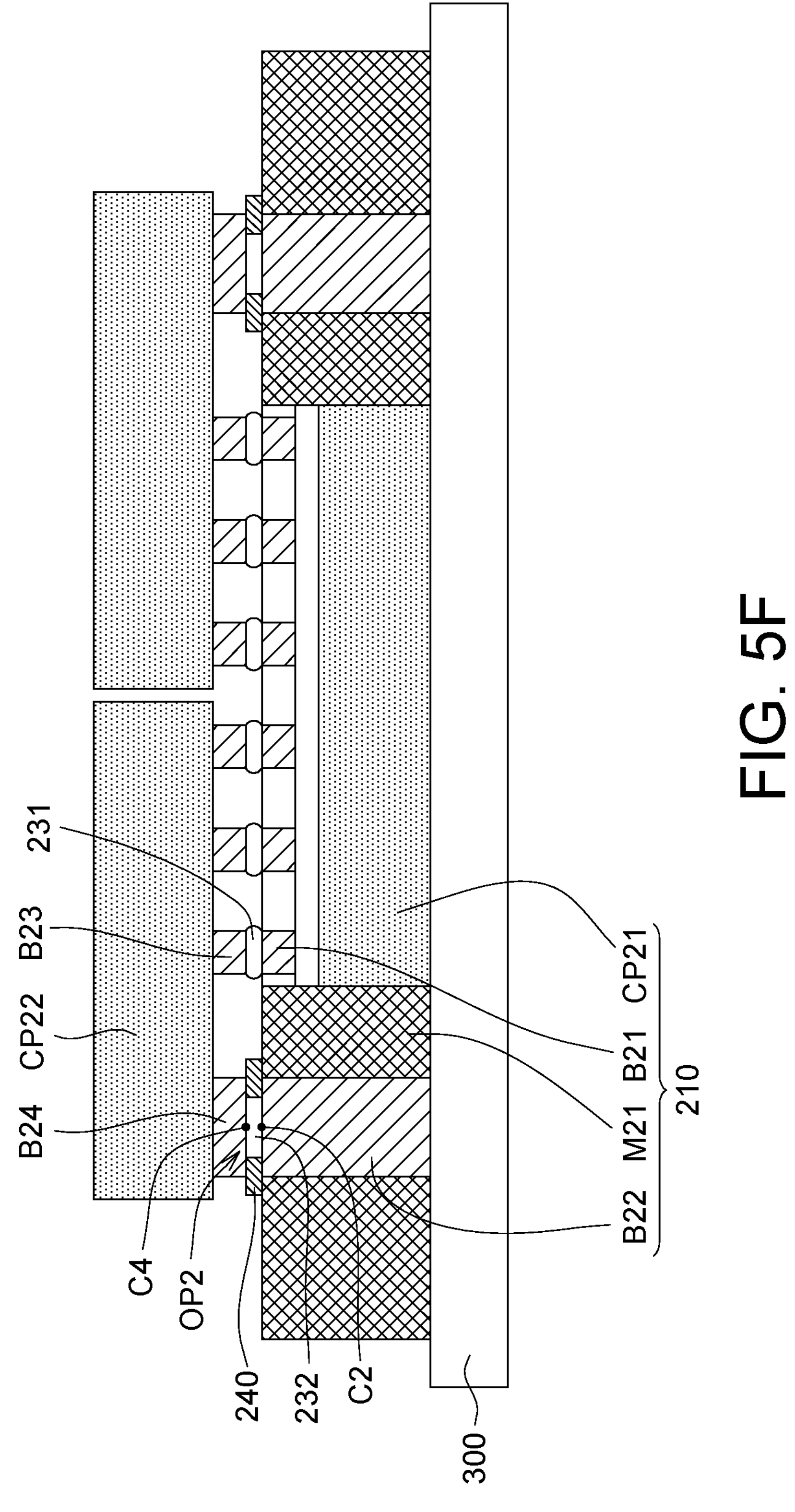
Figure 5G:
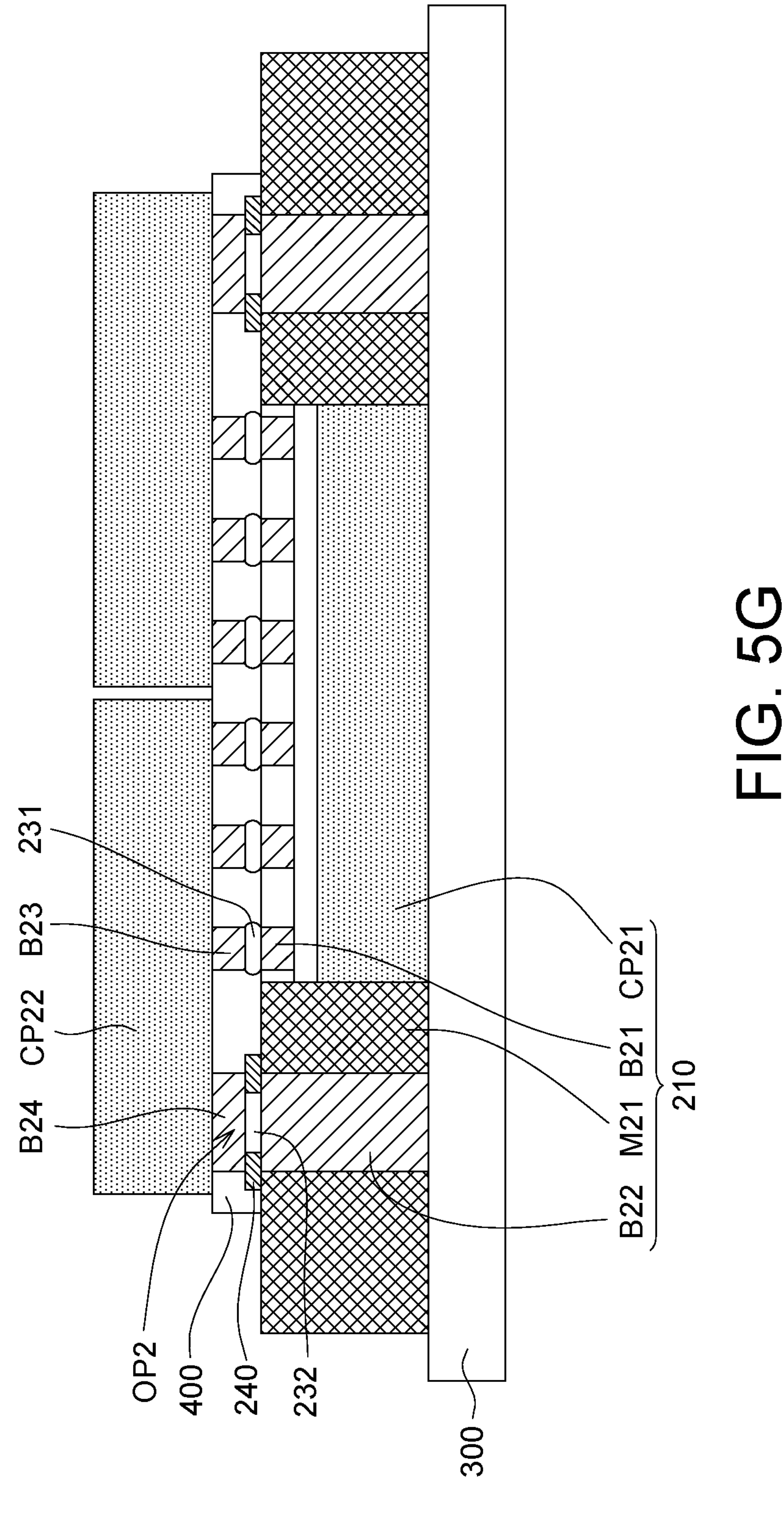
Figure 5H:
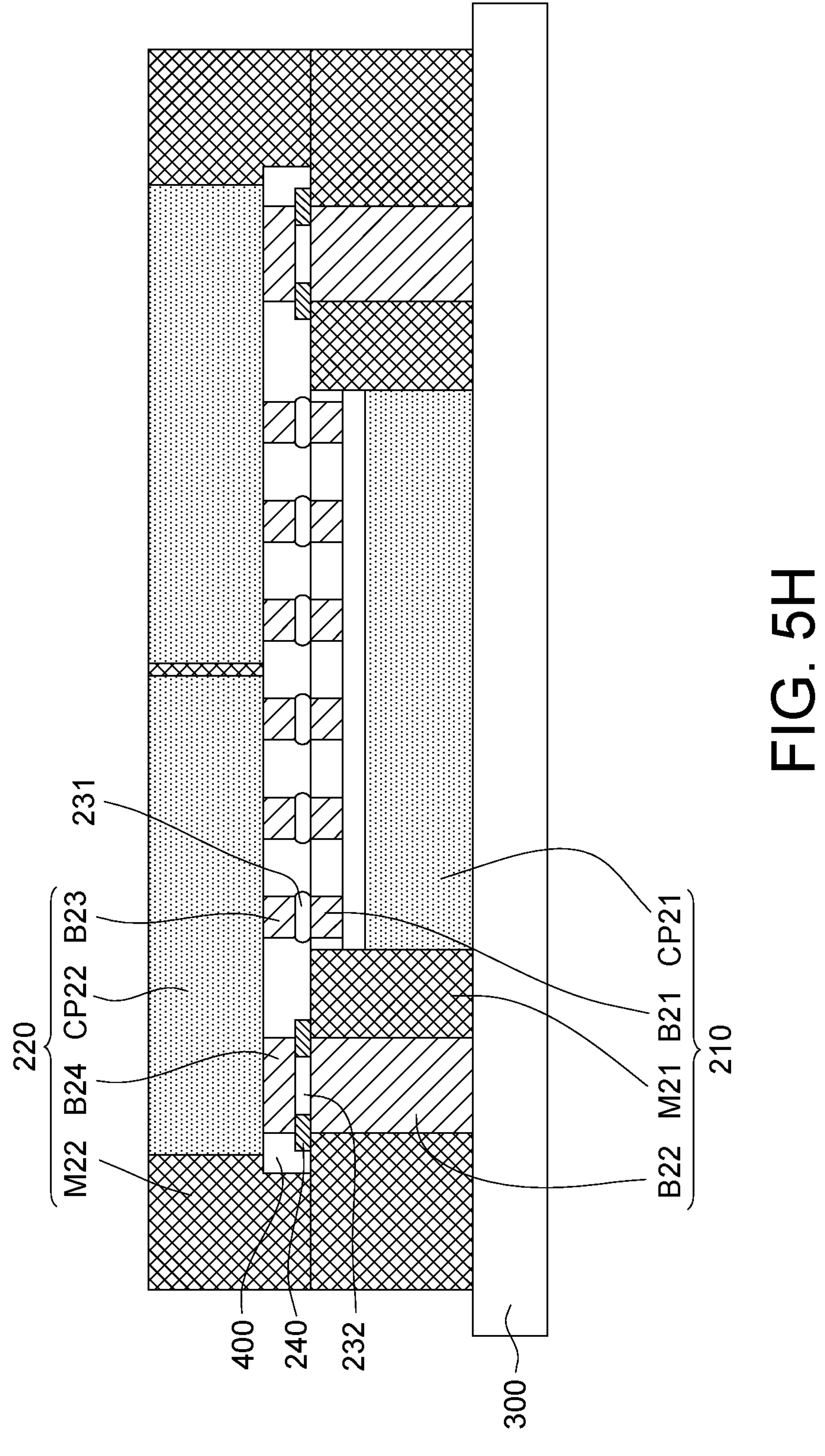

Next, in FIGS. 5F to 5H, the second semiconductor module 220 including the at least one third conductive structure B23 and the at least one fourth conductive structure B24 which is larger than the third conductive structure B23 is placed on the first semiconductor module 210. Because the third conductive structure B23 and the at least one fourth conductive structure B24 might be formed on the second chip CP22 via the same process, the relative locations of the third conductive structure B23 and the at least one fourth conductive structure B24 are fixed. However, the second conductive structure B22 and the first conductive structure B21 are formed via different processes and the first chip CP21 may be placed at a wrong location, the relative locations of the second conductive structure B22 and the first conductive structure B21 might not be located at the predetermined relative location.

As shown in FIG. 5F, the second chip CP22 is placed on the first semiconductor module 210. The third conductive structure B23 is aligned with the first conductive structure B21 and the fourth conductive structure B24 is aligned with the opening OP2 formed on the second conductive structure B22. As shown in FIG. 5F, a center C4 of the fourth conductive structure B24 is substantially overlapped with the center C2 of the opening OP2. In this step, the first jointing material 231 is reflowed to join the first conductive structure B21 and the third conductive structure B23 and the second jointing material 232 is reflowed to join the second conductive structure B22 and the fourth conductive structure B24. The first jointing material 231 and the second jointing material 232 are reflowed at the same time, so the second chip CP22 might be slightly shifted to align the third conductive structure B23 with the first conductive structure B21 and align the fourth conductive structure B24 with the opening OP2 formed on the second conductive structure B22

Then, as show in FIG. 5G, an under-fill material 400 is filled between the second chip CP22 and the second semiconductor module 220 to cover the first conductive structure B21, the second conductive structure B22, the third conductive structure B23, the fourth conductive structure B24, the first jointing material 231 and the second jointing material 232.

Next, as shown in FIG. 5H, the second molding material M22 is disposed to cover the second chip CP22 and the under-fill material 400, and then the CMP process or the CMG process is performed to expose one side of the second chip CP22.

Figure 5I:
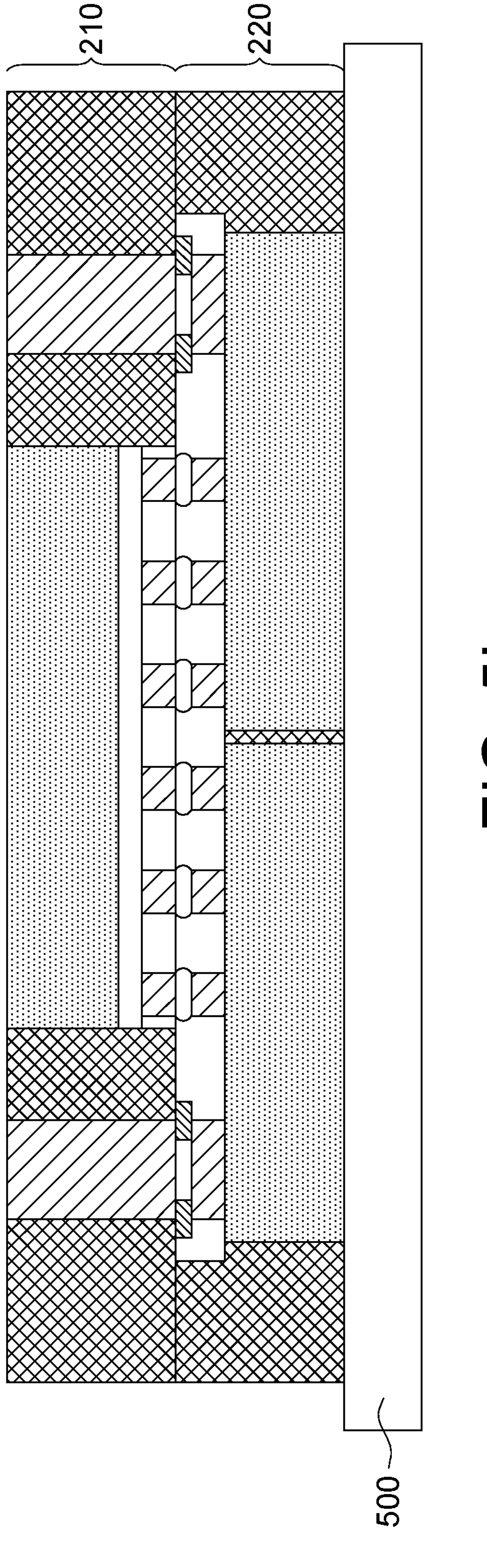

Then, as shown in FIG. 5I, the second semiconductor module 220 is bonded on another carrier 500 and then the first semiconductor module 210 is de-bonded from the carrier 300.

Figure 5J:
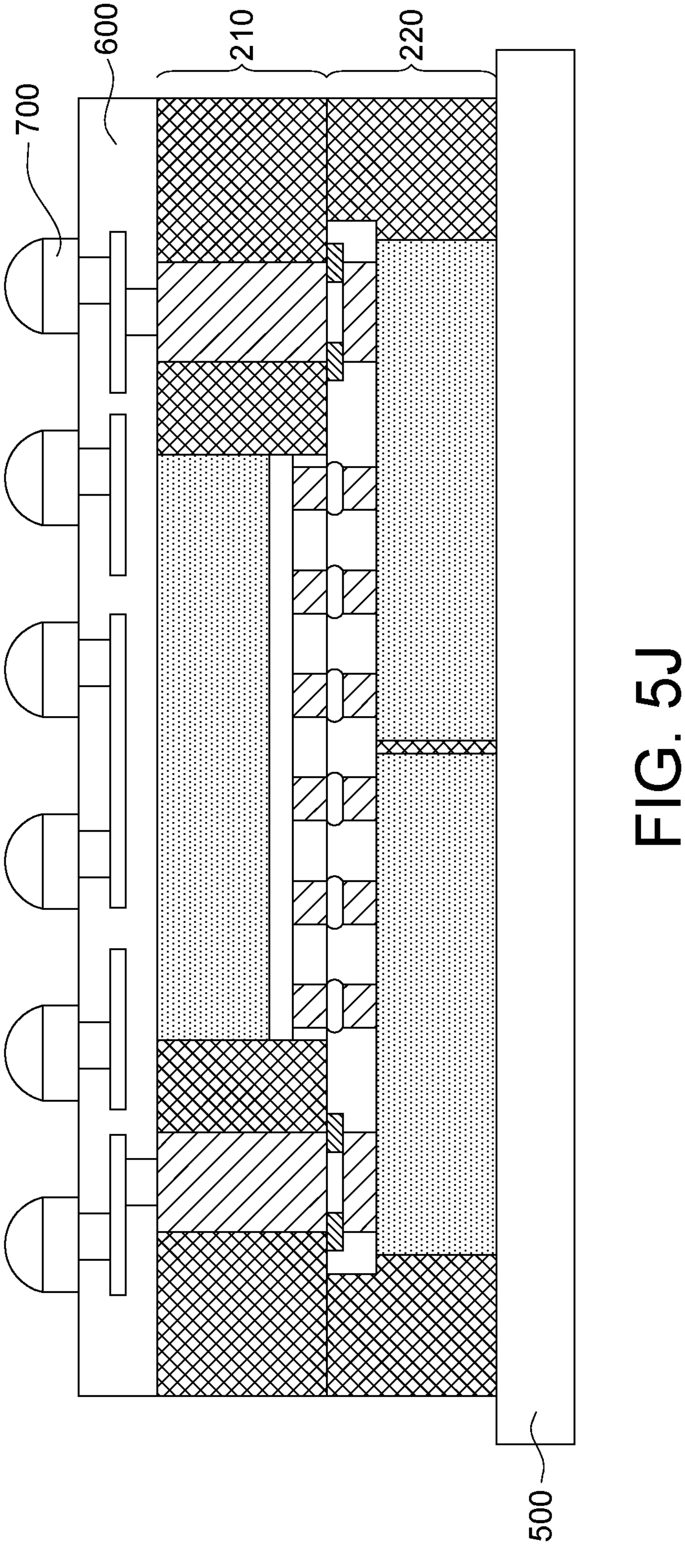

Next, as shown in FIG. 5J, a Redistribution layer (RDL) 600 and at least one bump 700 are disposed on the first semiconductor module 210.

Figure 5K:
Figure 5K:
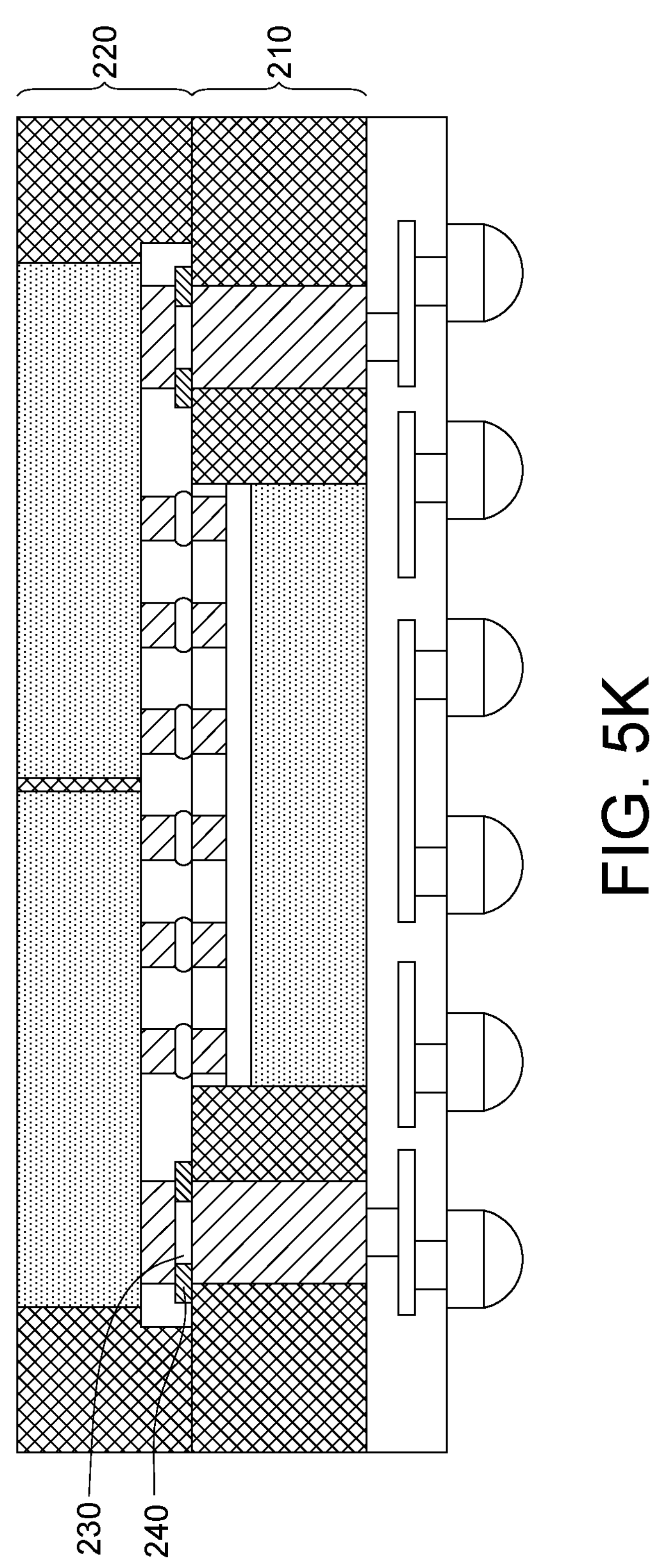

Afterwards, as shown in FIG. 5K, the semiconductor device 100 including the first semiconductor module 210, the second semiconductor module 220, the reorientation layer 240, the first jointing material 231 and the second jointing material 232 are formed.

According to the embodiments described above, the reorientation layer 240 covers part of the second conductive structure B22 to form the opening OP2. The reorientation layer 240 could compensate the offset between the second conductive structure B22 and the fourth conductive structure B24. Therefore, the connections between the first semiconductor module 210 and the second semiconductor module 220 can be accurately aligned.

The reorientation layer 240 is useful to overcome the misfit on multi-pitch bumps. The die attach accuracy specification in the fine pitch structure design rule could be mitigated. Furthermore, the joint yield for the fine pitch bump joint can be improved. I/O amounts can be increase without ant misfit. The semiconductor product may have strong competitiveness.

According to one embodiment, a semiconductor device is provided. The semiconductor device includes a first semiconductor module, a reorientation layer, a second semiconductor module and a plurality of jointing materials. The first semiconductor module has at least one first conductive structure and at least one second conductive structure. The reorientation layer covers part of the second conductive structure to form an opening. The second semiconductor module has at least one third conductive structure and at least one fourth conductive structure. The jointing materials are disposed between the first conductive structure and the third conductive structure, and disposed in the opening.

According to another embodiment, a method for manufacturing a semiconductor device is provided. The method includes the following steps. A first semiconductor module including at least one first conductive structure and at least one second conductive structure is formed. A reorientation layer is formed to cover part of the second conductive structure to form an opening. A second semiconductor module including at least one third conductive structure and at least one fourth conductive structure is placed on the first semiconductor module. The third conductive structure is substantially aligned with the first conductive structure, and the fourth conductive structure is offset from the second conductive structure.

According to an alternative embodiment, a semiconductor device is provided. The semiconductor device includes a first semiconductor module, a second semiconductor module, at least one first jointing material and at least one second jointing material. The first semiconductor module has at least one first conductive structure and at least one second conductive structure. The second semiconductor module has at least one third conductive structure and at least one fourth conductive structure. The first jointing material joins the first conductive structure and the third conductive structure so that the first conductive structure and the third conductive structure are substantially aligned with each other. The second jointing material joins the second conductive structure and the fourth conductive structure. In a top view of the semiconductor device, the second conductive structure and the fourth conductive structure are offset from each other and electrically connected to each other through the second jointing materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a first semiconductor module, including at least one first conductive structure and at least one second conductive structure;

forming a reorientation layer, covering part of the second conductive structure to form an opening; and placing a second semiconductor module including at least one third conductive structure and at least one fourth conductive structure on the first semiconductor module, wherein the third conductive structure is substantially aligned with the first conductive structure, and the fourth conductive structure is offset from the second conductive structure;

wherein a material of the reorientation layer is a dielectric material.

2. The method according to claim 1, further comprising:

forming a plurality of jointing materials on the first conductive structure and in the opening; and reflowing the jointing materials to join the first conductive structure and the third conductive structure and join the second conductive structure and the fourth conductive structure.

3. The method for manufacturing the semiconductor device according to claim 2, wherein the first conductive structure is disposed on an element, the element and the second conductive structure are formed individually, and the third conductive structure and the fourth conductive structure are disposed on a single element.

4. The method for manufacturing the semiconductor device according to claim 2, wherein the first conductive structure is a bump disposed on a first chip, the second conductive structure is a through mold via (TMV), the second conductive structure and the first chip are formed individually, and the third conductive structure and the fourth conductive structure are bumps disposed on a second chip.

5. The method for manufacturing the semiconductor device according to claim 2, wherein in a top view of the semiconductor device, a center of the opening and a center of the second conductive structure are located at different locations.

6. The method for manufacturing the semiconductor device according to claim 2, wherein in a top view of the semiconductor device, a center of the fourth conductive structure is substantially overlapped with a center of the opening.

7. The method for manufacturing the semiconductor device according to claim 2, wherein a thickness of each of the jointing materials is substantially identical to a thickness of the reorientation layer.

8. The method for manufacturing the semiconductor device according to claim 2, wherein the second conductive structure is larger than the first conductive structure.

9. The method for manufacturing the semiconductor device according to claim 2, wherein the fourth conductive structure is larger than the third conductive structure.

10. A method for manufacturing a semiconductor device, comprising:

forming a first semiconductor module, including at least one first conductive structure and at least one second conductive structure, wherein in a top view of the semiconductor device, the second conductive structure is larger than the at least one first conductive structure;

forming a reorientation layer, covering part of the second conductive structure to form an opening; and placing a second semiconductor module including at least one third conductive structure and at least one fourth conductive structure on the first semiconductor module, wherein the third conductive structure is substantially aligned with the first conductive structure, and the fourth conductive structure is offset from the second conductive structure;

wherein in a top view of the semiconductor device, a center of the opening and a center of the second conductive structure are located at different locations.

11. The method according to claim 10, further comprising:

forming a plurality of jointing materials on the first conductive structure and in the opening; and reflowing the jointing materials to join the first conductive structure and the third conductive structure and join the second conductive structure and the fourth conductive structure.

12. The method for manufacturing the semiconductor device according to claim 11, wherein the first conductive structure is disposed on an element, the element and the second conductive structure are formed individually, and the third conductive structure and the fourth conductive structure are disposed on a single element.

13. The method for manufacturing the semiconductor device according to claim 11, wherein the first conductive structure is a bump disposed on a first chip, the second conductive structure is a through mold via (TMV), the second conductive structure and the first chip are formed individually, and the third conductive structure and the fourth conductive structure are bumps disposed on a second chip.

14. The method for manufacturing the semiconductor device according to claim 11, wherein in a top view of the semiconductor device, a center of the fourth conductive structure is substantially overlapped with a center of the opening.

15. The method for manufacturing the semiconductor device according to claim 11, wherein a material of the reorientation layer is a dielectric material.

16. The method for manufacturing the semiconductor device according to claim 11, wherein a thickness of each of the jointing materials is substantially identical to a thickness of the reorientation layer.

17. The method for manufacturing the semiconductor device according to claim 11, wherein the second conductive structure is larger than the first conductive structure.

18. A method for manufacturing a semiconductor device, comprising:

forming a first semiconductor module, including at least one first conductive structure and at least one second conductive structure, wherein in a top view of the semiconductor device, sizes of the second conductive structure and the at least one first conductive structure are different;

forming a reorientation layer, covering part of the second conductive structure to form an opening; and placing a second semiconductor module including at least one third conductive structure and at least one fourth conductive structure on the first semiconductor module, wherein the third conductive structure is substantially aligned with the first conductive structure, and the fourth conductive structure is offset from the second conductive structure;

wherein the first conductive structure is a bump disposed on a first chip, the second conductive structure is a through mold via (TMV), the second conductive structure and the first chip are formed individually, and the third conductive structure and the fourth conductive structure are bumps disposed on a second chip.

19. The method for manufacturing the semiconductor device according to claim 18, wherein in a top view of the semiconductor device, a center of the opening and a center of the second conductive structure are located at different locations.

20. The method for manufacturing the semiconductor device according to claim 18, wherein in a top view of the semiconductor device, a center of the fourth conductive structure is substantially overlapped with a center of the opening.

* * * * *